US008992132B2

(12) United States Patent
Rapoport et al.

(10) Patent No.: US 8,992,132 B2
(45) Date of Patent: Mar. 31, 2015

(54) PNEUMATIC SAMPLE FEEDWAY

(71) Applicant: Aspect Imaging Ltd, Shoham (IL)

(72) Inventors: Uri Rapoport, Moshav Ben Shemen (IL); Itzchak Rabinovitz, Ness Tsiyona (IL)

(73) Assignee: Aspect Imaging Ltd., Shoham (IL)

( * ) Notice: Subject to any disclaimer, the term of this patent is extended or adjusted under 35 U.S.C. 154(b) by 0 days.

(21) Appl. No.: 13/954,388

(22) Filed: Jul. 30, 2013

(65) Prior Publication Data

US 2014/0050539 A1    Feb. 20, 2014

(30) Foreign Application Priority Data

Aug. 15, 2012 (IL) .......................................... 221494

(51) Int. Cl.
*B65G 51/36* (2006.01)
*B65G 51/26* (2006.01)
*G01R 33/30* (2006.01)
*B65G 51/22* (2006.01)

(52) U.S. Cl.
CPC .............. *B65G 51/26* (2013.01); *G01R 33/307* (2013.01); *B65G 51/22* (2013.01)
USPC ......................................................... 406/34

(58) Field of Classification Search
USPC .................................................... 406/34, 192
See application file for complete search history.

(56) References Cited

U.S. PATENT DOCUMENTS

| | | | | |
|---|---|---|---|---|
| 1,449,996 | A | * | 3/1923 | Hepperle ....................... 406/192 |
| 1,823,056 | A | * | 9/1931 | Marburg .......................... 406/10 |
| 2,679,990 | A | * | 6/1954 | Mathzeit et al. ................... 406/4 |
| 2,709,555 | A | * | 5/1955 | Schroder ....................... 406/192 |
| 2,943,814 | A | * | 7/1960 | Mittag et al. ...................... 406/5 |
| 3,907,231 | A | * | 9/1975 | Kreiner ........................... 406/19 |
| 4,239,420 | A | * | 12/1980 | Thibonnier et al. ............... 406/2 |
| 4,334,806 | A | * | 6/1982 | Liu ................................. 406/31 |
| 5,562,591 | A | * | 10/1996 | Marchand et al. ............ 588/259 |
| 6,068,428 | A | * | 5/2000 | Nair et al. ...................... 406/109 |
| 7,740,424 | B2 | * | 6/2010 | Pardini et al. ................... 406/34 |

* cited by examiner

*Primary Examiner* — William R Harp
(74) *Attorney, Agent, or Firm* — The Law Office of Michael E. Kondoudis

(57) ABSTRACT

A pneumatic sample feedway that is embeddable into a magnetic resonance imaging (MRI) device. The feedway includes: a plurality of capsules enclosing a biological tissue sample; and a conductor pipe connected to a source of a compressed fluid. The pipe receives a train of the capsules and pneumatically forwards the train into the MRI device. The pipe has a proximal terminal that loads the train of capsules into the pipe.

2 Claims, 4 Drawing Sheets

PNEUMATIC SAMPLE FEEDWAY

FIELD OF THE INVENTION

The present invention relates to a pneumatic tube transport and, more specifically, to a pneumatic sample feedway for a magnetic resonance imaging device.

BACKGROUND OF THE INVENTION

Pneumatic tubes are physical transport systems in which cylindrical containers are propelled through a network of tubes by compressed air or by a vacuum. The containers are vehicles for transporting physical objects. Pneumatic tubes were also briefly considered for a subway-like transportation of people, as well as a long-distance postal service.

SUMMARY OF THE INVENTION

It is hence one object of the invention to disclose a pneumatic sample feedway embeddable into a magnetic resonance imaging (MRI) device. The aforesaid feedway comprises: (a) a plurality of capsules configured for enclosing a biological tissue samples; and (b) a conductor (drive) pipe connectable to a source of a compressed fluid. The pipe is configured for receiving a train of the capsules and pneumatically forwarding thereof into the MRI device. The pipe has a proximal terminal and distal terminal. The proximal is configured for loading the train of capsules into the pipe.

It is also in the scope of the invention wherein the distal termination possibly provided with a catch lock device. The lock device is configured for locking the train of capsules, when a capsule contained in a magnetic field is measured, and opening the catch lock device such that the train of capsules is displaced within the pipe and a next capsule is fed for measurement.

Another object of the invention is to disclose a drive of the catch lock device selected from the group consisting of a mechanical drive, a pneumatic drive, an electromagnetic drive and any combination thereof.

A further object of the invention is to disclose a method of feeding of samples to an MRI device. The aforesaid method comprises the steps of (a) providing a pneumatic sample feedway embeddable into a magnetic resonance imaging (MRI) device; the feedway comprising: (i) a plurality of capsules configured for enclosing a biological tissue samples; (ii) a conductor (drive) pipe connectable to a source of a compressed fluid; the pipe configured for receiving the a train of the capsules and pneumatically forwarding thereof into the MRI device; the pipe having a proximal terminal and distal terminal; the proximal configured for loading the train of capsules into the pipe; the distal termination is provided with a catch lock device; the lock device is configured for locking the train of capsules when a capsule contained in a magnetic field is measured and opening the catch lock device such that the train of capsules is displaced within the pipe and next capsule is fed for measurement; (b) preparing samples to be measured by means of MRI device; (c) placing the samples into sample capsules; (d) loading the capsules into the pipe one by one (train); (e) feeding the capsules into a magnetic field of the MRI device.

It is another core purpose of the invention to provide the step of feeding the capsules comprising a step of discreetly displacing of the train of capsules such that the capsule train is locked, when a capsule contained in a magnetic field is measured, and displaced for one capsule distance between measurements.

A further object of the invention is to disclose the step of discreetly displacing of the train of capsules performed by a drive of the catch lock device is selected from the group consisting of a mechanical drive, a pneumatic drive, an electromagnetic drive and any combination thereof.

BRIEF DESCRIPTION OF THE DRAWINGS

In order to understand the invention and to see how it may be implemented in practice, a plurality of embodiments is adapted to now be described, by way of non-limiting example only, with reference to the accompanying drawings, in which.

DETAILED DESCRIPTION OF THE INVENTION

The following description is provided, so as to enable any person skilled in the art to make use of the invention and sets forth the best modes contemplated by the inventor of carrying out this invention. Various modifications, however, are adapted to remain apparent to those skilled in the art, since the generic principles of the present invention have been defined specifically to provide a pneumatic sample feedway embeddable into a magnetic resonance imaging (MRI) device and a method of using the same.

The term "pneumatic pipe" hereinafter refers to a system in which cylindrical capsules are propelled through the pipe by a compressed fluid.

The term "sample capsule" hereinafter refers to a magnetically transparent shell configured for receiving a sample to be measured within an MRI device.

Figure 1:
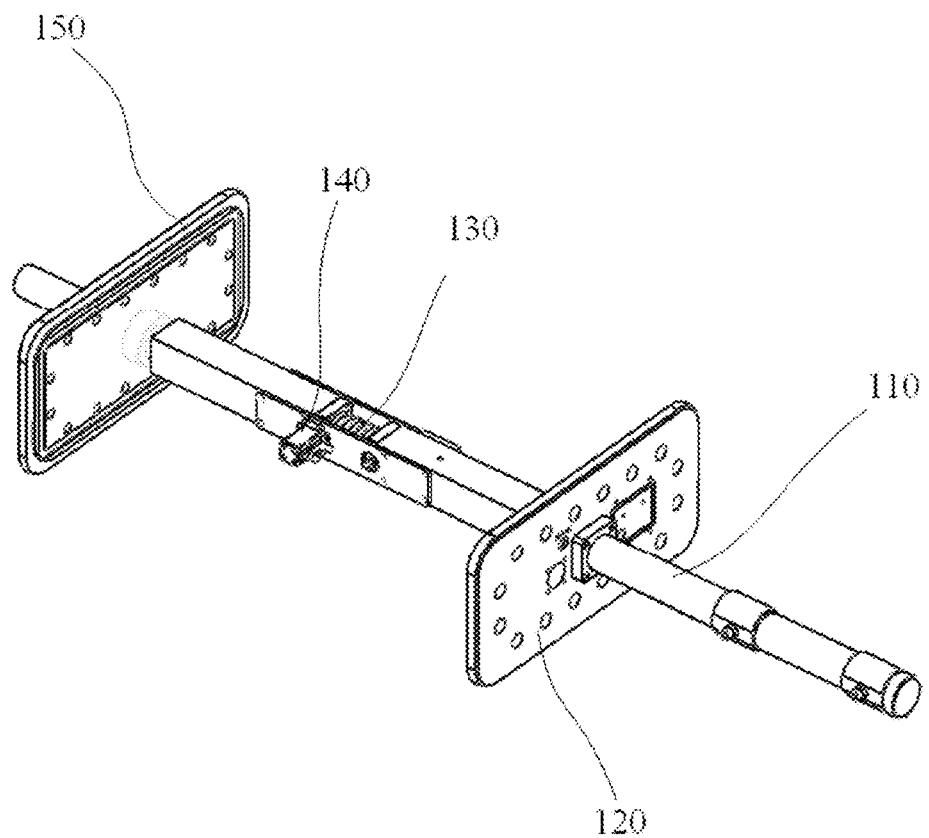
FIG. 1 is a schematic view of a pneumatic sample feedway.

Reference is now made to FIG. 1, presenting a pneumatic sample feedway adapted for embedding into an MRI device (not shown). The feedway comprises a pipe 110 in which a plurality of sample capsules (not shown) are loaded in a train-like manner. In accordance with one embodiment of the present invention, the pipe can be provided with an internal spring for forcing a train of the sample capsules through the pipe 110. A receptacle 130 is designed for receive the sample capsule to be measured. A catch lock device 140 locks the train of capsules when a capsule contained in the pneumatic cylinder 130 is measured. During a time period when catch lock device 140 is opened, the train of capsules is displaced within said pipe and next capsule is fed for measurement. Plates 120 and 150 are designed for mounting the feedway onto the MRI device.

Figure 2:
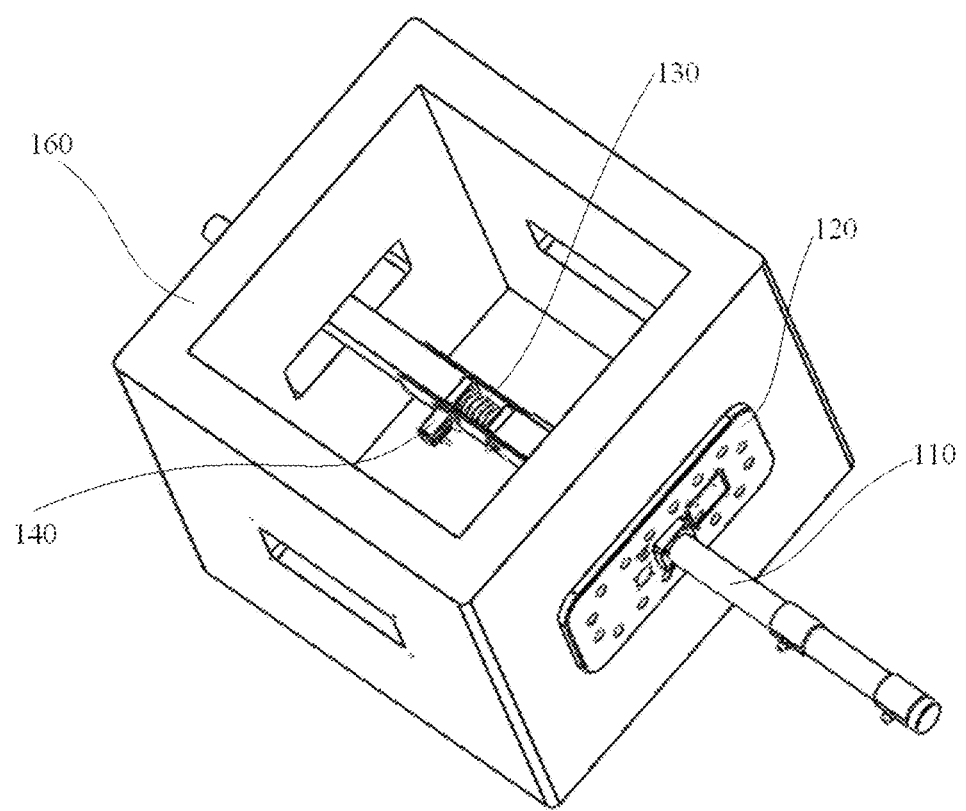
FIG. 2 is a schematic view of the feedway embedded into MRI device.

Reference is now made to FIG. 2, schematically showing the sample feedway embedded into a housing 160 of the MRI device. As seen FIG. 2, the plates 120 and 150 the sample feedway are mechanically secured to the housing 160.

Figure 3:
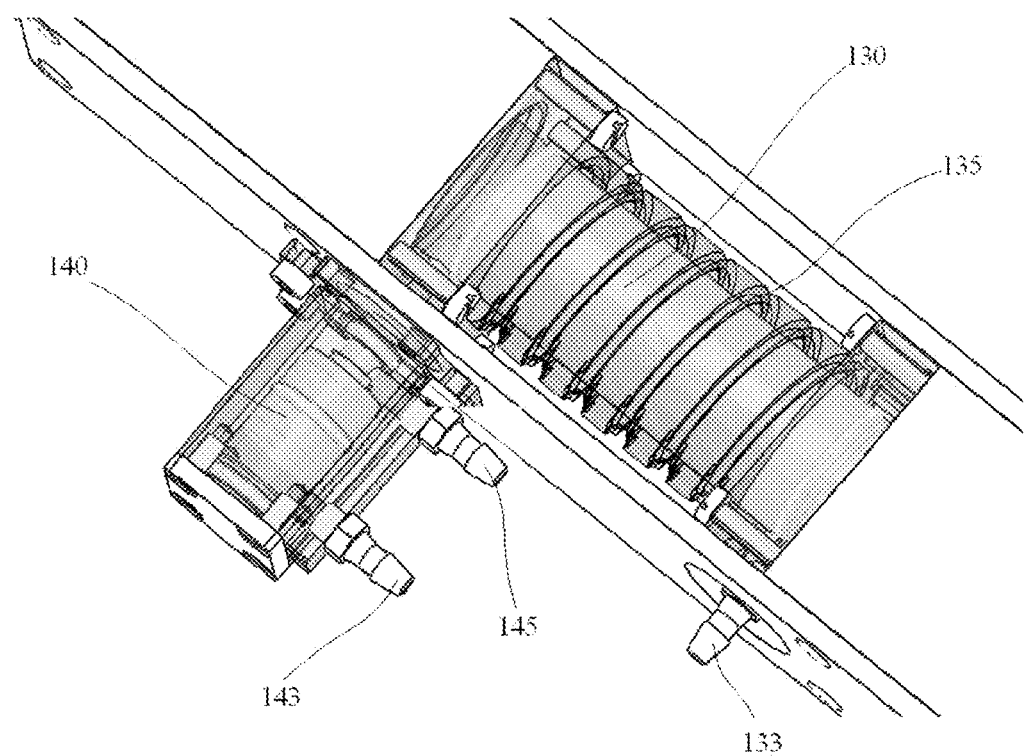
FIG. 3 is a schematic view of a pneumatic arrangement of the sample feedway.

Reference is now made to FIG. 3, showing an enlarged view of pneumatic arrangement of the present invention. The pneumatic cylinder 130 is accommodated within a measuring coil 135. A fitting 133 is designed for feeding a compressed fluid to the cylinder 130. Specifically, the fluid fed into the cylinder expulses the sample capsule from the cylinder 130 after measurement. When the measured capsule is expulsed from the cylinder 130, a next capsule in the train of capsules is displaced into the cylinder 130. Synchronically to this, the catch lock device locks the cylinder 140. According to on embodiment of the present invention, the catch lock device comprises a pneumatically driven bar (not shown). Fittings 143 and 145 are designed for feeding a compressed fluid creating a force which locks and opens the cylinder 140.

Figure 4:
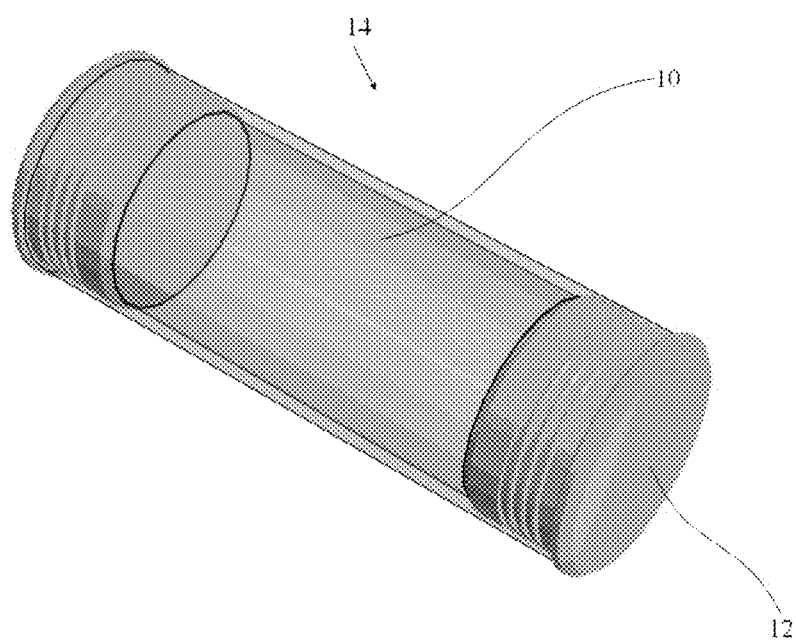
FIG. 4 is a schematic view of a sample capsule.

Reference is now made to FIG. 4, presenting an exemplary sample capsule 14 comprising a tubular member 10 and end caps 12. The sample capsule should be magnetically transparent and biologically neutral.

In accordance with one embodiment of the present invention, a pneumatic sample feedway embeddable into a magnetic resonance imaging (MRI) device is disclosed. The aforesaid feedway (a) a plurality of capsules configured for enclosing a biological tissue samples; and (b) a conductor (drive) pipe connectable to a source of a compressed fluid. The pipe is configured for receiving a train of the capsules and pneumatically forwarding thereof into the MRI device. The pipe has a proximal terminal and distal terminal. The proximal is configured for loading the train of capsules into the pipe.

It is a core feature of the invention to provide the distal termination provided with a catch lock device. The lock device is configured for locking the train of capsules, when a capsule contained in a magnetic field is measured, and opening the catch lock device such that the train of capsules is displaced within the pipe and a next capsule is fed for measurement.

In accordance with another embodiment of the present invention, a drive of said catch lock device is selected from the group consisting of a mechanical drive, a pneumatic drive, an electromagnetic drive and any combination thereof.

In accordance with one embodiment of the present invention, a method of feeding of samples to an MRI device is disclosed. The aforesaid method comprises the steps of (a) providing a pneumatic sample feedway embeddable into a magnetic resonance imaging (MRI) device; the feedway comprising: (i) a plurality of capsules configured for enclosing a biological tissue samples; (ii) a conductor (drive) pipe connectable to a source of a compressed fluid; the pipe configured for receiving the a train of the capsules and pneumatically forwarding thereof into the MRI device; the pipe having a proximal terminal and distal terminal; the proximal configured for loading the train of capsules into the pipe; the distal termination is provided with a catch lock device; the lock device is configured for locking the train of capsules when a capsule contained in a magnetic field is measured and opening the catch lock device such that the train of capsules is displaced within the pipe and next capsule is fed for measurement; (b) preparing samples to be measured by means of MRI device; (c) placing the samples into sample capsules; (d) loading the capsules into the pipe one by one (train); (e) feeding the capsules into a magnetic field of the MRI device.

It is another core feature of the invention to provide the step of feeding the capsules comprising a step of discreetly displacing of the train of capsules such that the capsule train is locked, when a capsule contained in a magnetic field is measured, and displaced for one capsule distance between measurements.

In accordance with one embodiment of the present invention, the step of discreetly displacing of the train of capsules is performed by a drive of said catch lock device is selected from the group consisting of a mechanical drive, a pneumatic drive, an electromagnetic drive and any combination thereof.

The invention claimed is:

1. A method of feeding of samples to an MRI device, said method comprising:
   a. providing a pneumatic sample feedway embeddable into a magnetic resonance imaging (MRI) device; said feedway comprising:
      i. a plurality of capsules configured for enclosing a biological tissue samples;
      ii. a conductor (drive) pipe connectable to a source of a compressed fluid; said pipe configured for receiving said a train of said capsules and pneumatically forwarding thereof into said MRI device; said pipe having a proximal terminal and distal terminal; said proximal configured for loading said train of capsules into said pipe;
   said distal termination is provided with a catch lock device; said lock device is configured for locking said train of capsules when a capsule contained in a magnetic field is measured and opening said catch lock device such that said train of capsules is displaced within said pipe and next capsule is fed for measurement;
   b. preparing samples to be measured by means of MRI device;
   c. placing said samples into sample capsules;
   d. loading said capsules into said pipe one by one (train); and
   e. feeding said capsules into a magnetic field of said MRI device;
   wherein said step of feeding said capsules comprises a step of discreetly displacing of said train of capsules such that said capsule train is locked when a capsule contained in a magnetic field is measured and displaced for one capsule distance between measurements.

2. The method according to claim 1, wherein said discreetly displacing is performed by a drive of said catch lock device is selected from the group consisting of a mechanical drive, a pneumatic drive, an electromagnetic drive and any combination thereof.

* * * * *